United States Patent
Lee et al.

(10) Patent No.: US 9,661,248 B2
(45) Date of Patent: May 23, 2017

(54) INTEGRATED CIRCUIT HAVING FLEXIBLE REFERENCE

(71) Applicants: Dennis Tunglin Lee, San Jose, CA (US); Guangbin Zhang, Cupertino, CA (US)

(72) Inventors: Dennis Tunglin Lee, San Jose, CA (US); Guangbin Zhang, Cupertino, CA (US)

(73) Assignee: CISTA SYSTEM CORP., Grand Cayman (KY)

( * ) Notice: Subject to any disclaimer, the term of this patent is extended or adjusted under 35 U.S.C. 154(b) by 155 days.

(21) Appl. No.: 14/562,752

(22) Filed: Dec. 7, 2014

(65) Prior Publication Data
US 2015/0171130 A1    Jun. 18, 2015

Related U.S. Application Data

(60) Provisional application No. 61/916,054, filed on Dec. 13, 2013.

(51) Int. Cl.
| | |
|---|---|
| *H01L 27/146* | (2006.01) |
| *H04N 5/3745* | (2011.01) |
| *H02M 3/156* | (2006.01) |
| *H04L 5/00* | (2006.01) |
| *H04N 5/378* | (2011.01) |
| *H03M 1/78* | (2006.01) |

(52) U.S. Cl.
CPC ........ *H04N 5/37455* (2013.01); *H02M 3/156* (2013.01); *H04L 5/0048* (2013.01); *H04N 5/378* (2013.01); *H03M 1/785* (2013.01)

(58) Field of Classification Search
CPC .. H04L 5/0048; H04N 5/378; H04N 5/37455; H03M 1/785; H02M 3/156
See application file for complete search history.

(56) References Cited

U.S. PATENT DOCUMENTS

| | | | | |
|---|---|---|---|---|
| 5,124,673 A | * | 6/1992 | Hershberger | ........ H03G 3/3068 333/18 |
| 5,614,891 A | * | 3/1997 | Zeinstra | .................. B60R 1/088 340/12.24 |
| 6,307,896 B1 | * | 10/2001 | Gumm | ..................... H04B 1/30 348/E17.003 |

(Continued)

OTHER PUBLICATIONS

Swindon Silicon Systems, Sensor Interface ASIC Design, Retrieved from the Internet: <URL: http://www.swindonsilicon.co.uk/mixed-signal-asic-solutions/sensor-interfaces-design/.*

*Primary Examiner* — Michael Zarroli
(74) *Attorney, Agent, or Firm* — Guosheng Wang; United States Research and Patent Firm

(57) ABSTRACT

The present invention relates to an integrated circuit having a flexible reference. In an example, the integrated circuit includes a reference generator, and the reference generator can generate a flexible reference signal in response to a control signal. The flexible reference signal can be changed freely by adjusting the control signal. By providing the flexible reference, the present invention can enhance the capability of verification and characterization for an integrated circuit design and reduce the physical layout area of the integrated circuit design. The present invention also relates to a method of operating the integrated circuit with a flexible reference signal.

15 Claims, 7 Drawing Sheets

(56) References Cited

U.S. PATENT DOCUMENTS

| | | | | |
|---|---|---|---|---|
| 6,407,955 B2* | 6/2002 | Manning | ............... | G11C 29/12 |
| | | | | 365/189.07 |
| 7,016,249 B2* | 3/2006 | Ross | ............... | G11C 5/147 |
| | | | | 365/189.09 |
| 7,528,590 B2* | 5/2009 | Wei | ............... | H02M 3/156 |
| | | | | 323/282 |
| 7,969,134 B2* | 6/2011 | Chen | ............... | H02M 3/156 |
| | | | | 323/285 |
| 8,355,469 B2* | 1/2013 | Baker | ............... | G01R 13/0254 |
| | | | | 375/316 |
| 9,118,850 B2* | 8/2015 | Luo | ............... | A61B 1/041 |
| 9,363,856 B2* | 6/2016 | Rutgers | ............... | H05B 33/0815 |
| 2002/0084927 A1 | 7/2002 | Krymski et al. | | |
| 2006/0077719 A1 | 4/2006 | Breitwisch et al. | | |
| 2009/0001275 A1 | 1/2009 | Okada | | |
| 2010/0214855 A1 | 8/2010 | Baker | | |
| 2012/0025062 A1 | 2/2012 | Neubauer et al. | | |
| 2012/0194715 A1 | 8/2012 | Skaug | | |
| 2013/0308006 A1 | 11/2013 | Finnila et al. | | |
| 2015/0049519 A1* | 2/2015 | Izadian | ............... | H02M 1/08 |
| | | | | 363/21.02 |

* cited by examiner

INTEGRATED CIRCUIT HAVING FLEXIBLE REFERENCE

CROSS-REFERENCE TO RELATED U.S. APPLICATIONS

This application claims the benefit of U.S. Provisional Patent Application No. 61/916,054, filed Dec. 13, 2013, which is incorporated herein by reference in its entirety.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

FIELD OF THE INVENTION

The present invention generally relates to a solid state integrated circuit design, and more particularly, to a solid state integrated circuit having a flexible reference.

BACKGROUND OF THE INVENTION

In the solid state integrated circuit design field, most circuits require an on-chip voltage/current reference in order to properly operate the circuits. One common source of stable and accurate on-chip reference is the band-gap reference circuit. Circuit designers generate different level of voltage references based on the band-gap reference to correctly bias circuits. It is essential to test and characterize a design on a fabricated silicon chip to ensure that the design is correct, and it can meet the requirement of specification. Unfortunately, a large physical layout area is needed to provide a wide range of fine-step references. To reduce the layout area, designers often choose the best-guess range of rough-step references. However, the consequence is that the capability of design characterization is limited, and the accuracy of characterization is greatly compromised.

For example, complementary metal-oxide-semiconductor ("CMOS") image sensors contain a photon sensing pixel array, readout and calibration circuits. Verifying and recording performance of sensor pixels and circuits is often called characterization of the CMOS image sensor. It is important to characterize the CMOS image sensor in details, since many important sensor parameters are highly relative to the fabrication technology and process variation. If designers choose the best-guess range of rough-step references, their capability in characterizing the CMOS image sensor is limited, due to the unsatisfactory accuracy of the characterization.

When design defects are identified (or process condition is shifted), the designer needs to modify the design and re-tape out fabrication masks to fix the defects. This is also known as ECO (engineer change order). ECO changes may cost a lot of money and a great amount of the project leap time.

On the other hand, fabrication area and power consumption are two major concerns in the solid state integrated circuit design. As electronic devices become smaller and more light-weighted, it is desirable to provide a wide range of fine-step reference source with a small physical layout area.

Advantageously, the present invention provides a solid state integrated circuit that exhibits merits such as improved accuracy of characterization, less fabrication area, and reduced power consumption, among others. The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY OF THE INVENTION

One aspect of the present invention provides an integrated circuit having a flexible reference, and operable with a flexible reference signal. The circuit comprises a reference generator configured to generate, in response to a control signal, the flexible reference signal.

According to an embodiment, an integrated circuit may include a reference generator that can generate, in response to a control signal, a flexible reference signal. The reference generator may include a signal convertor to receive the control signal and convert the control signal into a programming signal and a signal generator to receive the programming signal and generate, in response to the programming signal, the flexible reference signal.

The signal generator may include a digital to analog convertor (DAC), such as a R2R ladder DAC that has a plurality of stages. The programming signal contains a plurality of control bits to control the plurality of stages of the R2R ladder DAC, respectively.

The reference generator may further include a voltage regulator to receive a supply voltage and a reference signal to generate an operation voltage. The operation voltage may be provided to the signal convertor and the signal generator.

The integrated circuit of the invention may be widely used in any suitable measurement and control systems where a voltage reference is needed. Examples of such system include, but are not limited to, analog-to-digital converters, digital-to-analog converters, power voltage/current regulators, and various sensors such as touch ID sensors (finger print), heat/temperature sensors, and image sensors, among others. For example, the integrated circuit may be a complementary metal-oxide semiconductor (CMOS) image sensor. In such a case, the flexible reference signal may be used to characterize the CMOS image sensor, to optimize circuit/pixel/overall sensor performance, to improve production yield, and to reduce time consumption.

Another aspect of the invention provides a method for operating an integrated circuit. The method comprises the steps of: receiving, by a reference generator, a control signal; generating, by the reference generator in response to the control signal, a flexible reference signal; and operating the integrated circuit with the flexible reference signal.

In an example, the method further includes steps of: changing the control signal; providing the changed control signal to the reference generator; generating, by the reference generator in response to the changed control signal, a different flexible reference signal; and operating the integrated circuit with the different flexible reference signal.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form such as block diagrams in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

It is also to be understood that the terminology used herein is for the purpose of describing particular embodiments only, and is not intended to limit the scope of the invention. For example, when an element is referred to as being: "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
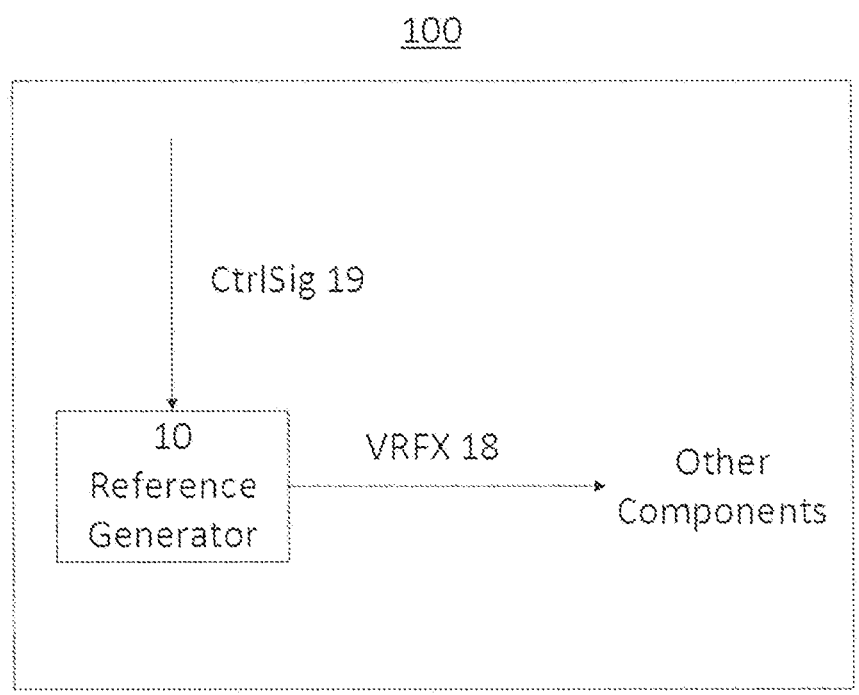
FIG. 1 is a block diagram showing an integrated circuit in accordance with an exemplary embodiment of the present invention.

FIG. 1 shows a typical integrated circuit 100 in which embodiments of the present invention may be implemented. Referring to FIG. 1, the integrated circuit 100 may include a reference generator 10. The reference generator 10 may generate, under the control of a control signal CtrlSig 19, a flexible/variable reference signal VRFX 18. In other words, the flexible reference signal VRFX 18 can be changed freely (or at will) by the control signal CtrlSig 19. The flexible reference signal VRFX 18 may then be used to operate other functional components (not shown) included in the integrated circuit 100. The flexible reference signal VRFX 18 may be beneficial to both the design and the practical application of the integrated circuit. For example, the reference signal required to operate the integrated circuit may shift from the design specification due to the manufacturing process, the environment where the integrated circuit is used, or even a miscalculation in the design stage. The flexible reference signal VRFX 18 can compensate the shift from the design specification, and thereby reduce the risk associated with the initial design, the manufacturing process, and the use of the integrated circuit.

In a particular embodiment, the integrated circuit 100 may be a complementary metal-oxide semiconductor (CMOS) image sensor, and the flexible reference signal VRFX 18 may be used in characterization of the CMOS image sensor 100. Under the control signal CtrlSig 19, the flexible reference signal VRFX 18 may vary with a fine step, thereby providing a wide range of references and thus accurate characterization parameters. The accurate characterization parameters may in turn improve the ability to fine tune the image performance of the CMOS image sensor (both circuit and pixel).

Figure 2:
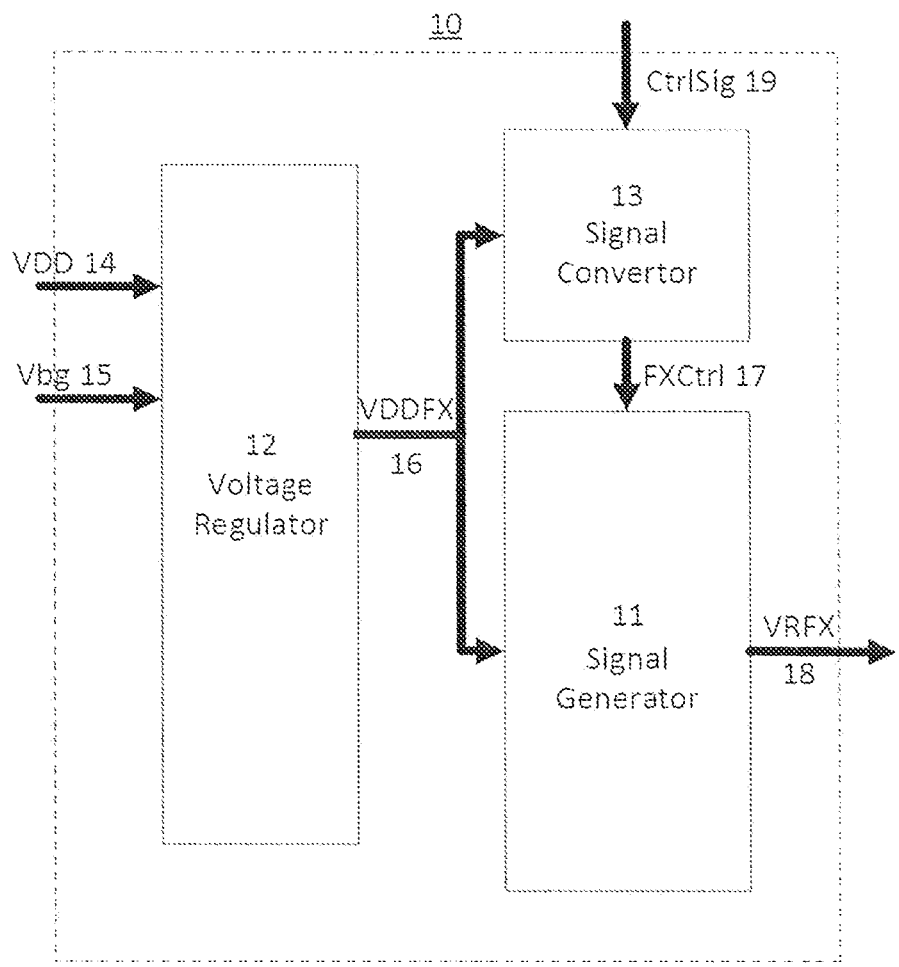
FIG. 2 depicts a block diagram showing a reference generator in accordance with an exemplary embodiment of the present invention.

Turning to FIG. 2, the reference generator 10 includes a signal convertor 13 and a signal generator 11. The control signal CtrlSig 19 may be provided first to the signal convertor 13 where it may be converted to a programming signal FXCtrl 17, and signal FXCtrl 17 may be provided to the signal generator 11 to generate the flexible reference signal VRFX 18 at a desired or predetermined level.

The signal convertor 13 and the signal generator 11 may each further receive an operation voltage signal VDDFX 16. In an example, the reference generator 10 may further include a voltage regulator 12 to generate the operation voltage signal VDDFX 16. The voltage regulator 12 may receive a supply voltage VDD 14, which may be provided from a power supply designed for the integrated circuit 100. The supply voltage VDD 14 may be within any voltage range. In an example, the supply voltage VDD 14 may be 2.8 volt. The voltage regulator 12 may further receive a reference signal Vbg 15 that has minimum variation with changes of process, operating voltage, and temperature condition (PVT). The reference signal Vbg 15 can be a voltage reference or a current biasing reference and it can be in any level without any specific limitation. In an example, the reference signal Vbg 15 can be a voltage reference provided from a band-gap reference voltage source, and it has minimum variation due to changes of operation conditions. The voltage regulator 12 uses the reference signal Vbg 15 and generates, from the supply voltage VDD 14, an operation voltage VDDFX 16 with minimum variation due to operation conditions. The operating characteristics of IC elements such as transistors change under a variety of conditions, often referred to as process, voltage, temperature (PVT) variations. PVT variations may be conceptualized as a box across which the operating characteristics of the IC elements move. One of ordinary skill in the art will appreciate that the three characteristics, process, voltage and temperature can be visualized as a three dimensional graph with a "slow corner" identifying a point when the three characteristics affect operating conditions, and a "fast corner" identifying a point when the three characteristics do not greatly affect operating conditions. For example, the operating characteristics may move from a fastest corner of PVT variations to a slowest corner of PVT variations, and everywhere in between. More specifically, the operating characteristics due to PVT variations may change with variations in manufacturing process as well as with variations in operating conditions. In the present invention, the terminology "minimum variation" is defined as a variation of less than 5%, preferably less than 3%, and more preferably less than 1%, cross PVT variation. For example, the average variation for a working band-gap reference circuit has less than 1% variation cross PVT variation. In some embodiments, a band-gap reference can be as accurate as ppm variation level. In typical embodiments of the invention, the average variation for operation voltage VDDFX 16 is dictated not only by the working band-gap reference circuit, but also by other factors such as op amp offset, de gain variation, it drop, and resistor value variation, among others. As such, generally the average variation for operation voltage VDDFX 16 is not as small as that for the working band-gap reference circuit. For example, VDDFX 16 variation may be in the range of from about 0.001% to about 3.0%, preferably in the range of from about 0.01% to about 1.0%, cross PVT variation.

Then, the operation voltage VDDFX 16 may be provided to the signal convertor 13 and the signal generator 11. The operation voltage VDDFX 16 may be in any voltage level without any specific limitation.

The control signal CtrlSig 19 may be in any supply voltage domain. In an example, the control signal CtrlSig 19 can be generated for 1.5 volt domain. The signal convertor 13 takes the control signal CtrlSig 19 and converts the control signal CtrlSig 19 to the programming signal FXCtrl 17, and the programming signal FXCtrl 17 can be in the operation voltage VDDFX domain.

The primary purpose of the signal generator 11 is to generate the flexible reference signal VRFX 18 which is insensitive to changes of operation conditions. The voltage level of the flexible reference signal VRFX 18 can be programmed and adjusted/changed by the programming signal FXCtrl 17. The signal generator 11 can be constructed using any kind of digital to analog convertor ("DAC"). For example, a R2R ladder DAC can be used for a medium speed application like reference supply due to its high accuracy and good manufacturability.

Figure 3:
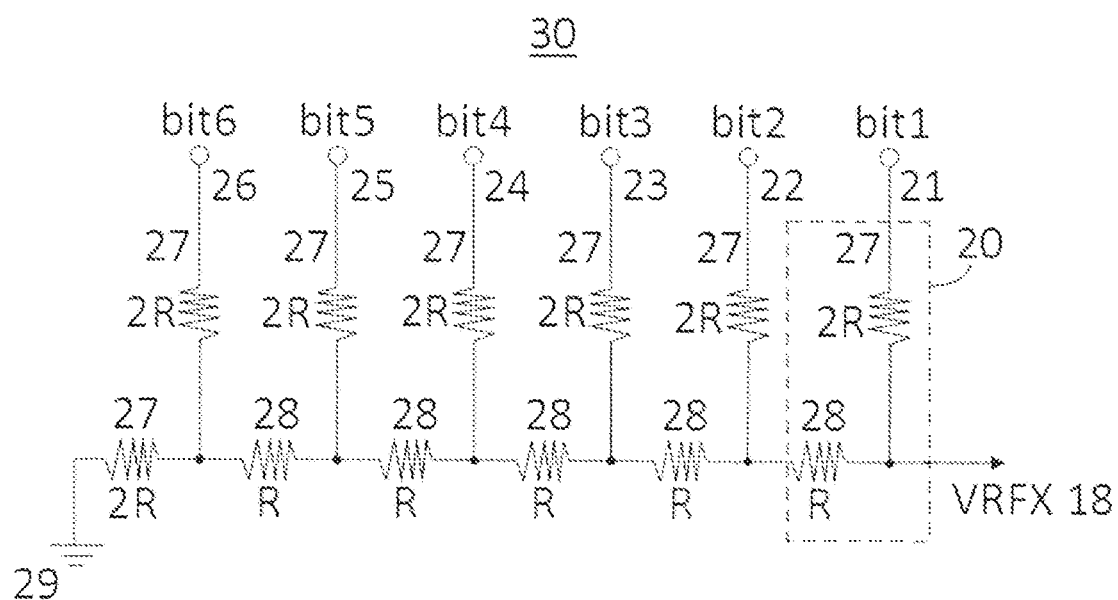
FIG. 3 is a circuit diagram of a signal generator in accordance with an exemplary embodiment of the present invention.

FIG. 3 shows a typical R2R ladder DAC 30 with 6 bits that can be used in the signal generator 11 in accordance with an exemplary embodiment of the present invention. Referring to FIG. 3, the R2R ladder DAC 30 is constructed with two values of resistors, resistor R 28 and resistor 2R 27 (twice of the value of R), no matter how many bits make up the ladder. The number of bits determines the resolution of the DAC, the more bits, the finer analog voltage steps at DAC output.

The "ladder" portrayal comes from the ladder-like topology of the resistor network. Referring to FIG. 3, the R2R ladder DAC 30 has a plurality of ladder stages 20, and each stage 20 contains a resistor R 28 that is connected between a first end and a second end, and a resistor 2R 27 that is connected between the first end and a corresponding bit, except the last stage that has two resistors 2R 27. The plurality of stages 20 are connected in series by connecting the second end of a stage to the first end of the next stage. The second end of the last stage is connected to a GND terminal 29, and the first end of the first stage provides an output voltage, i.e., the flexible reference signal VRFX 18.

In the example as shown in FIG. 3, the first stage 20 has a first bit 21, also called the Most significant bit (MSB), and the sixth stage 20 has a sixth bit 26, also called the least significant bit (LSB). The programming signal FXCtrl 17, which is provided from the signal convertor 13, has a plurality of control bits to control the bits of the plurality of stages 20, respectively. Each control bit is switchable between a high level such as the voltage VDDFX, and a low level such as ground. Depending on the number and location of the control bits switched to the voltage VDDFX or ground, the output voltage VRFX will vary between 0 volts and about VDDFX. If all bits bit1-bit6 are connected to the voltage VDDFX, the output voltage approaches VDDFX; if all bits are connected to ground, 0 volts is produced at the output; and if some bits are connected to ground while some to VDDFX, then an output voltage between 0 volts and VDDFX can be obtained.

The bits of the plurality of stages 20 range from the most significant bit (MSB) to the least significant bit (LSB). As the names indicate, the MSB, when activated, causes the greatest change in the output voltage and the LSB, when activated, will cause the smallest change in the output voltage. The output voltage VRFX caused by connecting a particular bit to VDDFX with all other bits grounded is $VRFX=VDDFX/2^N$, where N is the bit number. As the ladder stage 20 moves away from the output terminal, the impact of each stage bit (bit1 21, bit2 22, bit3 23, bit4 24, bit5 25 and bit6 26) on the output voltage VRFX 18 decreases by a factor of two. For bit1, VRFX=VDDFX/2, for bit2, VRFX=VDDFX/4, etc. In the example shown in FIG. 3, the output voltage VRFX may range from 0 to about VDDFX with a step of $VDDFX/2^6$. Therefore, the flexible reference signal VRFX 18 can be changed by adjusting control bits contained in the programming signal FXCtrl 17.

The signal generator 11 has been discussed above with the R2R ladder DAC 30 as an example. The R2R ladder DAC 30 is preferable due to its inherent accuracy and easy manufacturability. Those skilled in the art can understand that other suitable DAC devices such as a binary weighted ladder can also be used in the signal converter 11. In embodiments where another type of DAC is used in the signal generator 11, if necessary, the operation voltage signal VDDFX 16 may be used as the power supply for the DAC to maintain the flexible reference signal VRFX 18 with minimum PVT variation.

Figure 4:
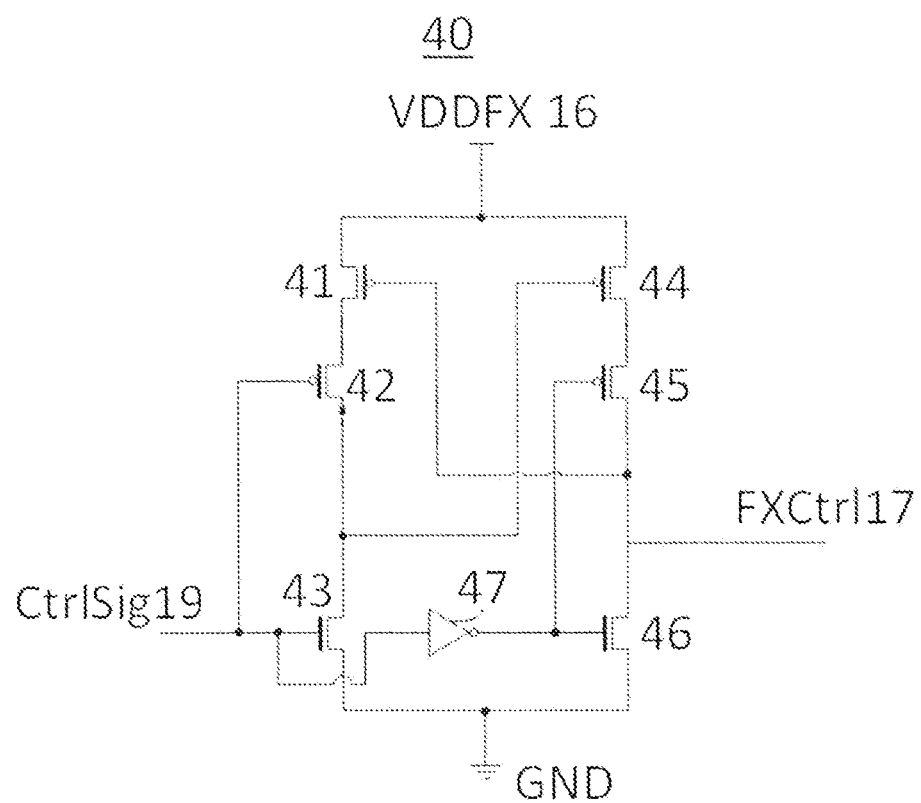
FIG. 4 shows a circuit diagram of a signal convertor in accordance with an exemplary embodiment of the present invention.

FIG. 4 shows a circuit diagram of a signal convertor 40 in accordance with an embodiment of the present invention. The signal convertor 40 may be used in the reference generator 10 as the signal convertor 13.

As shown in FIG. 4, the control signal CtrlSig 19 may be provided to the signal convertor 40 where it is converted to the programming signal FXCtrl 17 in the VDDFX 16 domain. The signal convertor 40 may be implemented as a typical voltage level shifter that includes an inverter 47 and a cross-coupled inverting pair composed of MOSFETs 41, 42, 43, 44, 45 and 46. Specifically, the PMOS transistor 41, the PMOS transistor 42 and the NMOS transistor 43 are connected in series in this order between the supply voltage VDDFX 16 and the ground GND, and the PMOS transistor 44, the PMOS transistor 45 and the NMOS transistor 46 are connected in series in this order between the supply voltage VDDFX 16 and the ground GND, in parallel with the MOS transistors 41, 42 and 43. The gate of the PMOS transistor 41 is connected to a connecting point between the PMOS transistor 45 and the NMOS transistor 46, and a gate of the PMOS transistor 44 is connected to a connecting point between the PMOS transistor 42 and the NMOS transistor 43. The control signal CtrlSig 19 is provided to the gate of the PMOS transistor 42 and the NMOS transistor 43 and further to the input of the inverter 47, and the output of the inverter 47 is provided to the gate of the PMOS transistor 45 and the NMOS transistor 46. The programming signal FXCtrl 17 is extracted from the connecting point between the PMOS transistor 45 and the NMOS transistor 46.

The control signal CtrlSig 19 first goes into the inverter 47, and then the input and output of the inverter 47 drive the cross-coupled inverting pair 41-46, thereby generating the programming signal FXCtrl 17 in the VDDFX 16 domain.

Figure 5:
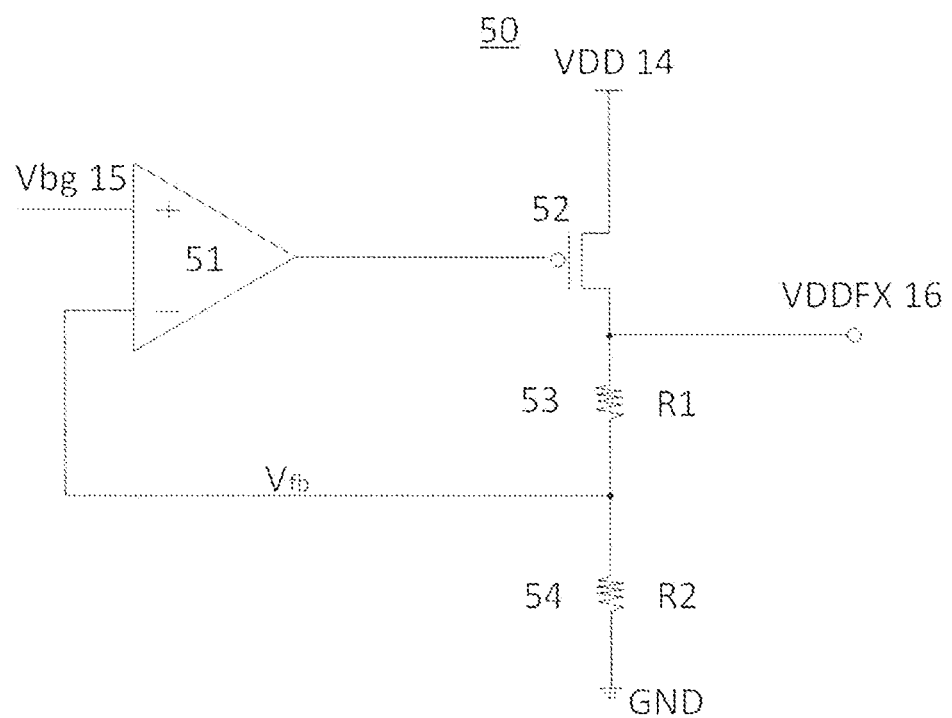
FIG. 5 is a circuit diagram of a voltage regulator in accordance with an exemplary embodiment of the present invention.

FIG. 5 shows a circuit diagram of a voltage regulator 50 in accordance with an exemplary embodiment of the present invention. The voltage regulator 50 may be used in the reference generator 10 as the voltage regulator 12. As shown in FIG. 5, the voltage regulator 50 includes a PMOS transistor 52, a first resistor 53 and a second resistor 54 that are connected in series in this order between the supply voltage VDD 14 and the ground GND. The first resistor 53 has a resistance R1, and the second resistor 54 has a resistance R2. The gate of the PMOS transistor 52 receives output from an operational amplifier 51. A positive input of the operational amplifier 51 receives the reference signal Vbg 15, and a negative input of the operational amplifier 51 receives a feedback voltage Vfb from a connecting point between the first and second resistors 53 and 54. The operation voltage signal VDDFX 16 is extracted from a connecting point between the PMOS transistor 52 and the first resistor R1.

The PMOS transistor 52 operates in a saturation region, and the feedback voltage Vfb may be fixed at the same level as the reference signal Vbg 15. Then, the operation voltage VDDFX 16 may be determined by the equation VDDFX= $(1+R1/R2) \cdot Vbg$. Since the reference signal Vbg 15 has minimum variation with changes of process, operating voltage, and temperature condition (PVT), the resulting voltage VDDFX 16 is also resistant to the PVT variation.

Figure 6:
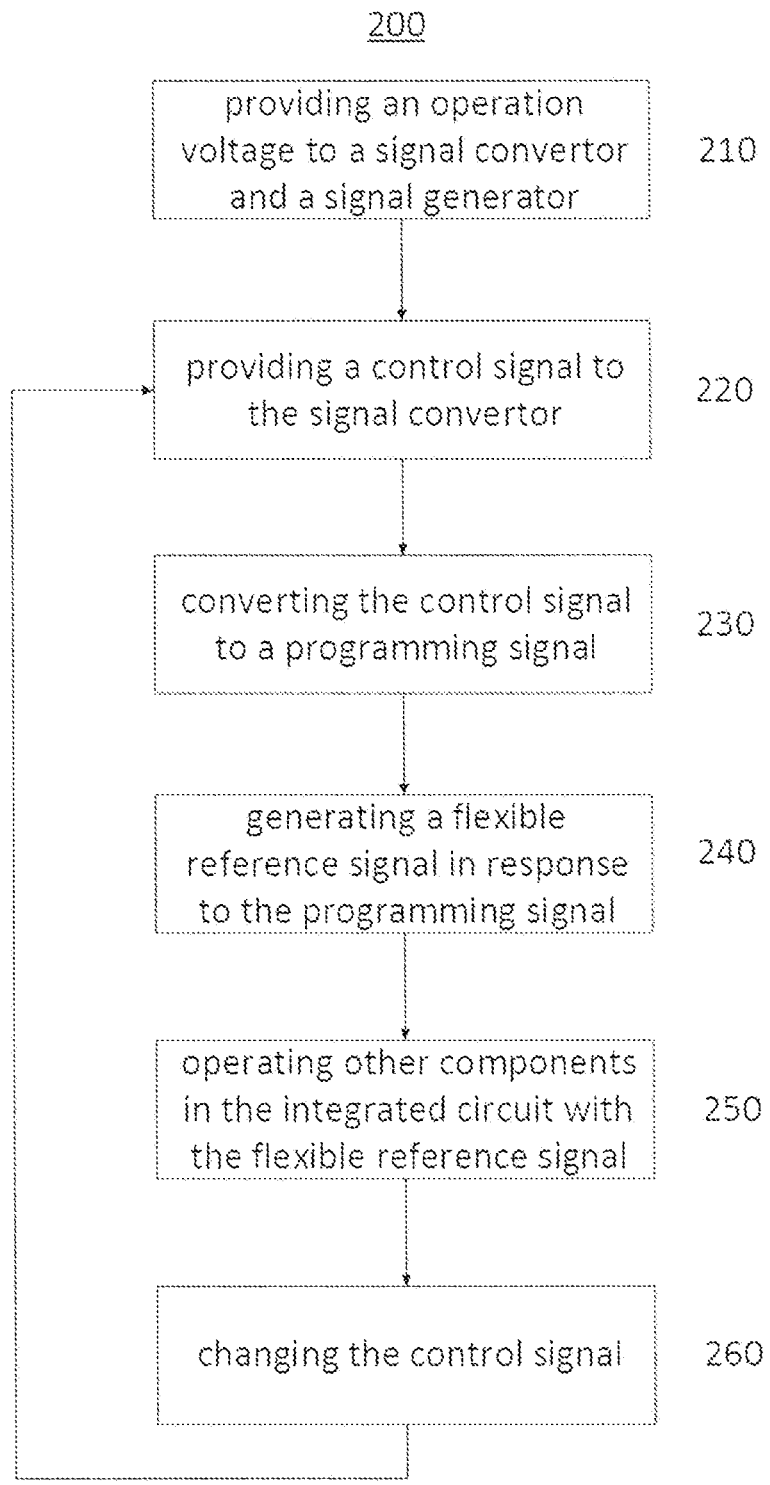
FIG. 6 illustrates a flow chart showing a method of operating an integrated circuit in accordance with an exemplary embodiment of the present invention.

An exemplary method 200 for operating the integrated circuit 100 will now be described in details with reference to the flow chart shown in FIG. 6. It would be appreciated that the method may be implemented with more or less steps, and the steps may be performed in a different order than as shown in FIG. 6. For example, two or more steps may be performed concurrently, and a step shown after another step may be performed before the "another step". Under the teaching of the present invention, such variations and modifications would become apparent to those skilled in the art.

Referring to FIG. 6, the method 200 starts at the block 210, where the voltage regulator 12 provides an operation voltage VDDFX 16 that has minimum variation due to operation conditions to the signal convertor 13 and the signal generator 11. As discussed above, the voltage regulator 12 may utilize the supply voltage VDD 14 and the reference signal Vbg 15 to venerate the operation voltage VDDFX 16.

At the block 220, the control signal CtrlSig 19 is provided to the signal convertor 13. The signal convertor 13 converts, at the block 230, the control signal CtrlSig 19 into the programming signal FXCtrl 17 in the VDDFX 16 domain and then provide the programming signal FXCtrl 17 to the signal generator 11.

Next, at the block 240, the signal generator 11 responds to the programming signal FXCtrl 17 by generating the flexible reference signal VRFX 18. In embodiments where the signal generator 11 includes the R2R ladder DAC 30, the programming signal FXCtrl 17 may contain a plurality of control bits which may be assigned to control the plurality of stages 20, respectively, of the R2R ladder DAC 30.

Next, at the block 250, the flexible reference signal VRFX 18 may be used to operate other components included in the integrated circuit 100.

If necessary, the method 200 may further include, at the block 260 a step of changing the control signal CtrlSig 19. Depending on different situations, the integrated circuit 100 may need to change its bias point in order to optimize the performance. The control signal CtrlSig 19 may be changed manually or automatically in response to change of situations. For example, the integrated circuit 100 may further include a temperature sensor to measure the ambient temperature at which the integrated circuit 100 operates. In response to change of the ambient temperature, the control signal CtrlSig 19 may be changed. Then, the method 200 may proceed back to the block 220 and thus a different flexible reference signal VRFX 18 may be generated at the block 240. The different flexible reference signal VRFX 18 may serve for, for example, a different bias point of the integrated circuit 100, such as different sensor gain or exposure time, etc.

In an example, the integrated circuit 100 may be a CMOS image sensor, and the flexible reference signal 18 may be used in characterization of the CMOS image sensor. Under the control of the control signal CtrlSig 19, the flexible reference signal 18 may vary in a wide range with a fine step, so the CMOS image sensor may be characterized in details and optimal operation parameters for the CMOS image sensor may be determined accurately.

Figure 7:
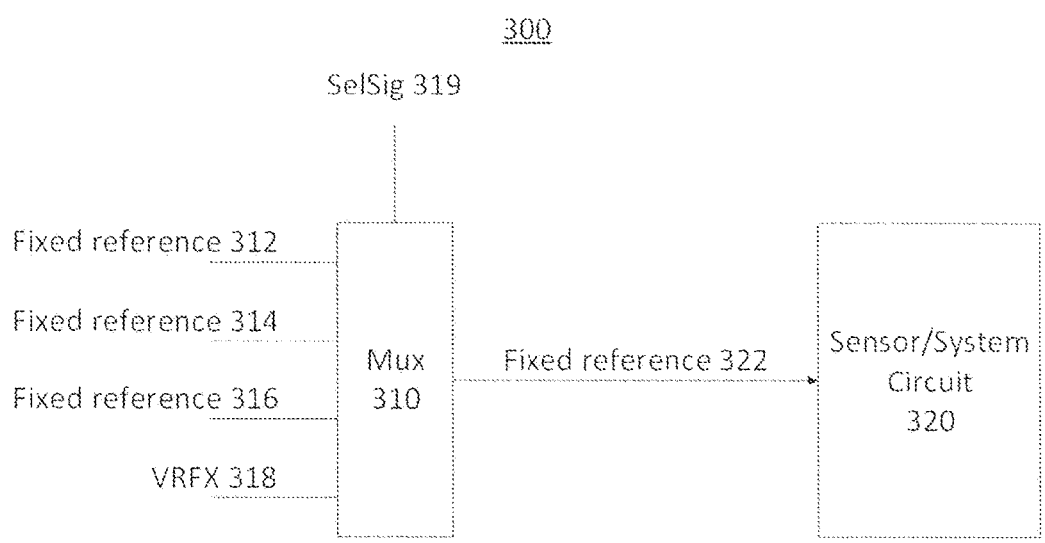
FIG. 7 is a system in which embodiments of the present invention may be implemented therein.

FIG. 7 shows a system 300 in which embodiments of the present invention may be implemented. As shown, the system 300 includes a sensor/system circuit 320 that operates with a reference signal 322. Typically, a plurality of fixed reference signals with different levels may be generated and provided to a multiplexer 310. Under the control of a selecting signal SelSig 319, the multiplexer 310 allows one of the reference signals to pass as the reference signal 322 to operate the sensor/system circuit 320. In the example shown in FIG. 7, four reference signals 312, 314, 316 and 318 are provided to the multiplexer 310.

In the system 300, one of the reference signals 312-318, (318 in FIG. 7) may be replaced by the flexible reference signal VRFX, such as the flexible reference signal VRFX 18 previously discussed. Thereby, it can extend the flexibility of the reference source.

The advantages of the present invention may become apparent from the above-discussed embodiments. By providing the flexible reference signal that can be programmed freely (at will) by the designers of the integrated circuit, the present invention allows the designers not only to perform more accurate characterization, but also to increase the efficiency of characterization. Therefore, the capability of verification and characterization of an integrated circuit design is significantly improved.

On the other hand, since the critical reference of the integrated circuit design can be adjusted easily using the present invention, the risk associated with initial IC design may be greatly reduced. The present invention also reduces the negative impact from ECO changes. Small miscalculation or small device size shift can be compensated using the flexible reference. It can provide an alternative solution for the yield loss due to process condition shift. The reference can be easily adjusted to match the process shift to increase design margin and improve the yields in production stage. Thus, the present invention can save cost in research and developing, and more importantly, the project leap time. Time to market is critical especially in the semiconductor industry because consumer electronic products are usually outdated quickly.

In addition, the physical layout area of the integrated circuit may be reduced due to the fact that the present invention provides a flexible reference that designers can choose and program. Therefore, no extra layout area is required to generate the wide range of references.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. An integrated circuit operable with a flexible reference signal, comprising a reference generator configured to generate, in response to a control signal, the flexible reference signal;
wherein the reference generator comprises a signal convertor configured to receive the control signal and to convert the control signal into a programming signal; and a signal generator configured to receive the programming signal and generate, in response to the programming signal, the flexible reference signal; and
wherein the reference generator comprises a voltage regulator configured to receive a supply voltage and generate an operation voltage having a variation of from about 0.001% to about 3.0% cross PVT variation; and wherein the operation voltage is provided to the signal convertor and the signal generator.

2. The integrated circuit according to claim 1, wherein the signal generator comprises a digital to analog convertor (DAC).

3. The integrated circuit according to claim 2, wherein the DAC comprises a R2R ladder DAC that has a plurality of stages, and wherein the programming signal contains a plurality of control bits to control the plurality of stages of the R2R ladder DAC.

4. The integrated circuit according to claim 1, wherein the signal convertor comprises a voltage level shifter.

5. The integrated circuit according to claim 1, wherein the control signal is in any voltage domain, and wherein the programming signal is in the operation voltage domain.

6. The integrated circuit according to claim 1, wherein the voltage regulator further receives a reference signal to generate the operation voltage.

7. The integrated circuit according to claim 1, wherein the integrated circuit is a complementary metal-oxide semiconductor (CMOS) image sensor, and wherein the flexible reference signal is used to characterize the CMOS image sensor.

8. The integrated circuit according to claim 1, further comprising a multiplexer configured to receive the flexible reference signal as well as one or more fixed reference signals and output, in response to a selecting signal, one of the flexible and fixed reference signals.

9. A method for operating an integrated circuit, comprising:
receiving, by a reference generator, a control signal, wherein the reference generator comprises a signal convertor configured to receive the control signal, a signal generator configured to generate the flexible reference signal, and a voltage regulator configured to receive a supply voltage and generate an operation voltage having a variation of from about 0.001% to about 3.0% cross PVT variation; and wherein the operation voltage is provided to the signal convertor and the signal generator;
converting, by the signal convertor, the control signal into a programming signal;
providing the programming signal from the signal convertor to the signal generator, wherein the signal generator is configured to generate the flexible reference signal under the control of the programming signal;
generating, by the reference generator in response to the programming signal, a flexible reference signal; and
operating the integrated circuit with the flexible reference signal.

10. The method according to claim 9, wherein the signal generator comprises a R2R ladder digital to analog convertor (DAC) that has a plurality of stages, and wherein the programming signal contains a plurality of control bits.

11. The method according to claim 10, wherein the step of providing the programming signal from the signal convertor to the signal generator comprises assigning the plurality of control bits of the programming signal to the plurality of stages of the R2R ladder DAC, so as to control the generation of the flexible reference signal.

12. The method according to claim 9, wherein the control signal is in any voltage domain, and wherein the programming signal is in the operation voltage domain.

13. The method according to claim 9, further comprising:
receiving, by the voltage regulator, a supply voltage and a reference signal to generate the operation voltage.

14. The method according to claim 9, further comprising:
changing the control signal;
providing the changed control signal to the reference generator;
generating, by the reference generator, in response to the changed control signal, a different flexible reference signal; and
operating the integrated circuit with the different flexible reference signal.

15. The method according to claim 9, wherein the integrated circuit is a complementary metal-oxide semiconductor (CMOS) image sensor, and wherein the step of operating the integrated circuit comprises characterizing the CMOS image sensor with the flexible reference signal.

* * * * *